(12) United States Patent
Pichler et al.

(10) Patent No.: US 11,636,303 B2
(45) Date of Patent: Apr. 25, 2023

(54) GROUND SWITCH

(71) Applicant: NXP B.V., Eindhoven (NL)

(72) Inventors: Thomas Pichler, Graz (AT); Ivan Jesus Rebollo Pimentel, Graz (AT)

(73) Assignee: NXP B.V., Eindhoven (NL)

( * ) Notice: Subject to any disclaimer, the term of this patent is extended or adjusted under 35 U.S.C. 154(b) by 174 days.

(21) Appl. No.: 17/247,997

(22) Filed: Jan. 4, 2021

(65) Prior Publication Data

US 2022/0215222 A1 Jul. 7, 2022

(51) Int. Cl.
*G06K 19/077* (2006.01)
*G06K 19/07* (2006.01)
*H02M 3/07* (2006.01)

(52) U.S. Cl.
CPC ... *G06K 19/07773* (2013.01); *G06K 19/0713* (2013.01); *H02M 3/07* (2013.01)

(58) Field of Classification Search
CPC ........ G06K 19/07773; G06K 19/0713; H02M 3/07; H02M 1/08; H03K 17/08122; H03K 17/063
See application file for complete search history.

(56) References Cited

U.S. PATENT DOCUMENTS

| | | | | |
|---|---|---|---|---|
| 7,167,090 B1 * | 1/2007 | Mandal | ................... | H01Q 23/00 340/538.14 |
| 7,944,279 B1 | 5/2011 | Waffaoui | | |
| 8,326,256 B1 * | 12/2012 | Kuhn | ................. | G06K 19/0709 340/572.1 |
| 8,964,436 B2 | 2/2015 | Kwong et al. | | |
| 9,594,997 B1 | 3/2017 | Buescher | | |
| 10,387,760 B2 | 8/2019 | Wu | | |
| 10,819,319 B1 * | 10/2020 | Hyde | ................. | G06K 19/0715 |
| 11,411,492 B1 * | 8/2022 | Pichler | ............... | G06K 19/0709 |
| 2014/0104910 A1 | 4/2014 | Kwong et al. | | |

FOREIGN PATENT DOCUMENTS

EP 2518873 A1 10/2012
JP 2004-207437 A 7/2004

OTHER PUBLICATIONS

Trung, Nguyen Thanh et al., "Sub-threshold CMOS Voltage-Multipliers using Hybrid RF-Piezoelectric Energy Scavenging"; 2014 IEEE 5th International Conference on Communications and Electronics (ICCE); Jul. 30-Aug. 1, 2014, Da Nang, Vietnam; DOI: 10.1109/CCE.2014.6916719.

* cited by examiner

*Primary Examiner* — Seung H Lee

(57) ABSTRACT

A ground switch is disclosed. The ground switch includes an antenna port, a pair of switching devices coupled with the antenna port and a charge pump coupled with the pair of devices and configured to turn on/off the pair of devices based on an AC input signal received through the antenna port and a DC offset voltage added to the AC input signal. The ground switch further includes a clamping circuit to clamp an output of the charge pump. The ground switch is configured to provide a stable ground to components of devices such that a radio frequency identification (RFID) device.

16 Claims, 3 Drawing Sheets

GROUND SWITCH

BACKGROUND

Radio Frequency Identification (RFID) refers to a wireless system comprised of two components: tags and readers. The reader is a device that has one or more antennas that emit radio waves and receive signals back from the RFID tag. Tags, which use radio waves to communicate their identity and other information to nearby readers, can be passive or active. Passive RFID tags are powered by the reader and do not have a battery. Active RFID tags are powered by batteries. Near Field Communication (NFC) is a wireless communication technology that acts over short distances for two-way communication. The use of NFC tags is growing in several markets, including the medical, consumer, retail, industrial, automotive, and smart grid markets. NFC is a type of RFID technology. RFID Tags need a ground (GND) switch 100 (FIG. 1) for generating a local ground on the RFID Tag and also ensuring that there is no high negative voltage at the input of the RFID Tag. The ground switch 100 plays an important role in the RF-Frontend of the RFID Tag. Typically, the ground switch 100 is a primary contributor to the parasitic capacitance of the RF frontend. This parasitic capacitance leads to a non-linear behavior of the input capacitor in the RF-Frontend and therefore has a significant impact on the performance of the RFID Tag due to power dependent de-tuning. As the devices MNavss, MNbvss, used in a typical GND switch, have to withstand all operating conditions and electrostatic discharge (ESD) events the devices MNavss, MNbvss start to operate at a higher threshold voltage.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a ground switch is disclosed. The ground switch includes an antenna port, a pair of switching devices coupled with the antenna port and a charge pump coupled with the pair of devices and configured to turn on/off the pair of devices based on an AC input signal received through the antenna port and a DC offset voltage added to the AC input signal. The ground switch further includes a clamping circuit to clamp the output of the charge pump to a predefined level. The ground switch is configured to provide a stable ground to components of devices such that a radio frequency identification (RFID) device.

In some examples, the clamping circuit includes a first clamp switch and a second clamp switch and the charge pump includes a first output capacitor and a second output capacitor at the output of the charge pump. The first output capacitor is coupled between a gate of the first clamp switch and a first terminal of the antenna port and the second output capacitor is coupled between a gate of the second clamp switch and a second terminal of the antenna port. The clamping circuit is configured to clamp the output of the charge pump to a level such that an amplitude of the AC input signal added to the DC offset voltage fluctuates above and below a threshold voltage of each of the pair of switching devices. A ground port is included to provide a ground to connected components. The charge pump includes an input capacitor coupled with a terminal of the antenna port. The charge pump further includes a first charge pump switch and a second charge pump switch both coupled with the input capacitor. The type of the first charge pump switch is different from the type the second charge pump switch. In some examples, diodes may be used in place of the first charge pump switch and the second charge pump switch.

The charge pump may include a first NMOS transistor and a second NMOS transistor coupled with each other via sources and the first and the second NMOS are coupled between a first terminal and a second terminal of the antenna port through a first capacitor and a second capacitor. The charge pump may further include a first PMOS transistor and a second PMOS transistor. The drain of the first PMOS transistor is coupled with the gate of the first NMOS transistor and the drain of the second PMOS transistor is coupled with the gate of the second PMOS. In some examples, the body terminal of the first PMOS transistor is coupled with the source of the second PMOS transistor and the body terminal of the second PMOS transistor is coupled with the source of the first PMOS transistor.

In another example, a radio frequency identification (RFID) device is disclosed. The RFID device includes the ground switch described herein to provide a stable ground to other components of the RFID device.

In another embodiment, a method of providing a stable ground to circuit components of a radio frequency identification (RFID) device is disclosed. The method includes receiving AC input signal from an antenna, generating a DC offset voltage and adding the DC offset voltage to the AC input signal, limiting the DC offset voltage to a DC offset threshold and applying the limited DC offset voltage added to the AC input signal to a gate of a ground transistor coupled with a ground output. The clamping circuit is configured to clamp the output of the charge pump to a level such that an amplitude of the AC input signal added to the DC offset voltage fluctuates above and below a threshold voltage of the ground transistor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Figure 1:
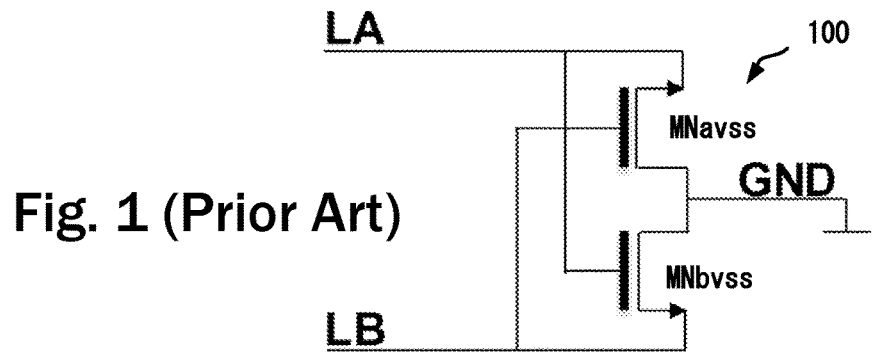
FIG. 1 depicts a typical ground switch for RFID tags.

Note that figures are not drawn to scale. Not all components of the improved ground switch are shown. The omitted components are known to a person skilled in the art.

DETAILED DESCRIPTION

Many well-known manufacturing steps, components, and connectors have been omitted or not described in details in the description so as not to obfuscate the present disclosure.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", "one example", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

RFID tags can store a range of information from one serial number to several pages of data. RFID readers can be mobile so that they can be carried by hand, or they can be mounted on a post or overhead. RFID reader systems can also be built into the architecture of a cabinet, room, or building. NFC is a technology based on RFID technology. NFC technology can be used to provide peer-to-peer communication or one way communication. When two NFC enabled devices are very close to each other, about 4 cm or less, they can communicate with each other using the radio waves. Of the two devices communicating using NFC, at least of them has to be an active device (powered). In many cases, this would be a smartphone, tablet, security pad, or a payment terminal. The other device can be either active or passive (unpowered). Using NFC, two devices can be set up in less than one-tenth of a second.

In an active peer-to-peer (P2P) mode, two active devices create a wireless communication channel between them. The active device, with an external power supply, can power the passive device with the electromagnetic field coming from the active device. NFC passive devices are used in many applications because the passive NFC device can be a simple tag. NFC devices communicate with each other via radio waves. The active NFC device has to be enabled (turned on) first. The radio waves for NFC are generated using an antenna. NFC works by exploiting the properties of electromagnetic fields, using the inductive coupling between NFC devices. It operates at the 13.56 MHz frequency, which is a license-free section of HF on the RF spectrum.

FIG. 1 shows a typical ground switch 100 that includes a first switch MNavss and a second switch MNbvss. Two devices MNavss, MNbvss are alternately used for connecting one of the antenna terminals LA, LB to ground (GND). As these devices MNavss, MNbvss have to withstand all field strength condition as well as ESD events, the device size is relatively bigger with withstand the operating conditions. However, the larger device size leads to a relatively large parasitic capacitance to the frontend capacitor. Further, due to the larger size, the threshold voltage ($V_{TH}$) of these devices is also relatively higher, hence requires higher gate voltage to turn the devices MNavss, MNbvss on.

Figure 2:
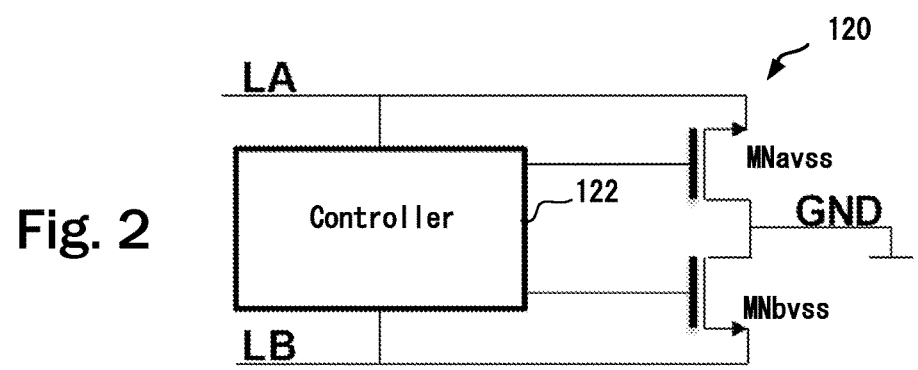
FIG. 2 depicts an improved ground switch for RFID tags in accordance with one or more embodiments of the present disclosure.
Figure 3:
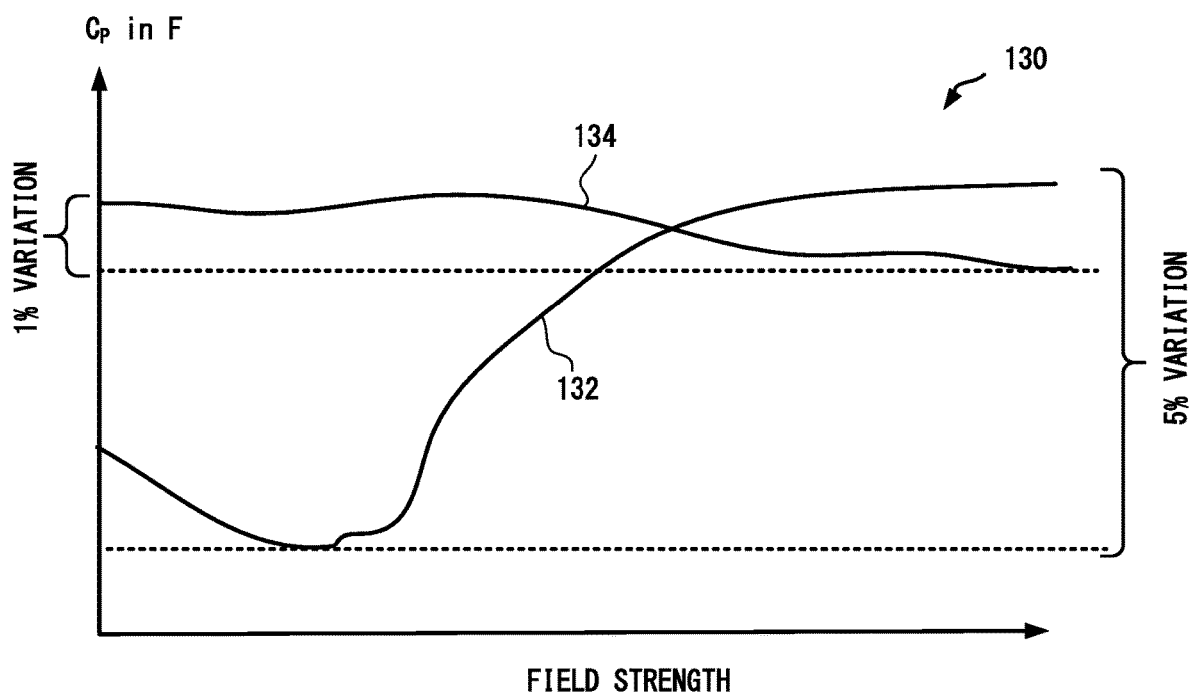
FIG. 3 shows a comparative curve of parasitic capacitance at various field strengths.

FIG. 2 shows an improved ground switch 120. The improved ground switch 120 includes a switch controller 122 to turn the devices MNavss, MNbvss on/off. As shown in FIG. 3, the improved ground switch 120 provides a substantially flat input capacitance curve 134 compared to the input capacitance curve 132 of a typical ground switch 100 (FIG. 1). The embodiments of the ground switch described herein provide a stable input impedance at varying input signal strength, to the connected components in a device, such an RFID device. The improved ground switch 120 also reduces the voltage needed for operating the devices MNavss, MNbvss. A stable ground connection contributes to noise reduction and more reliable clock recovery. The improved ground switch 120 flattens the input capacitor variation over field strength. The flattening of the capacitance curve may result in a reduced de-tuning, In some examples, the de-tuning may be reduced approximately 80%. The devices MNavss, MNbvss can be turned on using a relatively lower voltage due to the threshold cancelation provided by the controller 122. The embodiments described herein also improves the operating bandwidth range.

Figure 4:
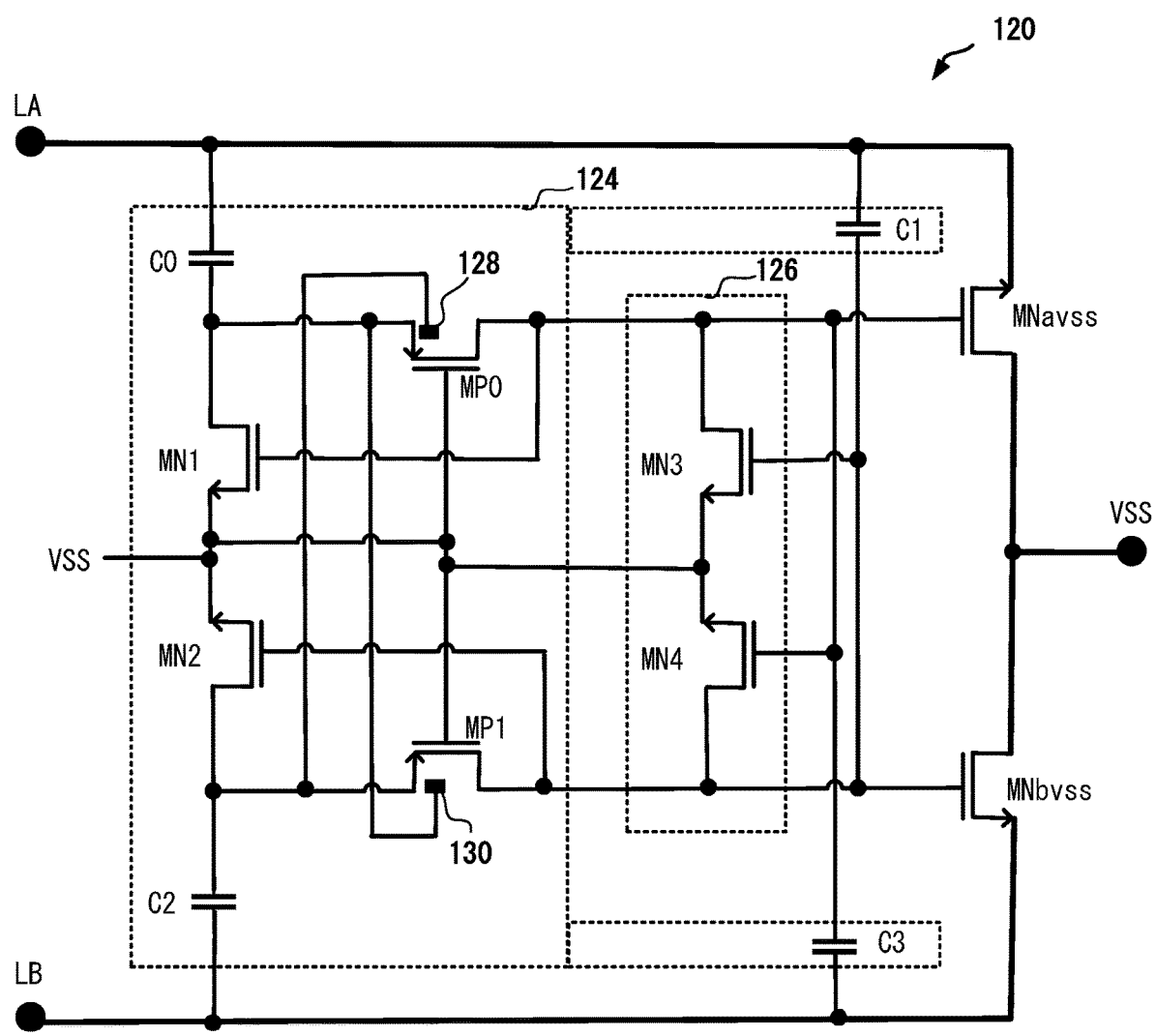
FIG. 4 shows a ground switch control circuit in accordance with one or more embodiments.

FIG. 4 shows an example implementation of the improved ground switch 120. The improved ground switch 120 includes a charge pump 124 that receives input signal from an antenna terminals LA, LB. The capacitors C1 and C3 at the output of the charge pump 124 enables the charge pump 124 is configured to add a DC offset to the high frequency AC signal received from the antenna terminals LA, LB. The improved ground switch 120 also includes a clamping circuit 126 that is configured to clamp the output of the charge pump 124 to a predefined voltage within a predefined signal strength range (i.e., the strength of the AC signal received from the antenna terminals LA, LB). The clamping circuit 126 limits the DC offset added to the input AC signal.

The charge pump 124 is formed by devices MN1, C0, MP0 provides a DC offset and the capacitor C3 adds the input AC signal to the DC offset voltage. The type of the device MN1 is opposite the type of the device MP0. Similarly the devices MN2, C2, MP1 provides a DC offset in the other direction of the AC signal and the capacitor C1 adds the AC signal to the DC offset voltage and the charge pump 124 is self-limiting using the clamping circuit 126. The clamping circuit 126 includes devices MN3, MN4. The clamping circuit 126 is configured to be a linear clamp to cap the output of the charge pump 124 to a predefined voltage at lower field strengths. If the field strength exceeds a predefined threshold, the clamping device MN3, MN4 acts as switches because the devices MN3 and MN4 transitions from acting as diodes to acting as switches. The transition threshold is defined by the threshold voltage ($V_{TH}$) of the devices MN3, MN4. This transitioning behavior allows to turn off the effect of the charge pump under higher field strength condition where without this effect the GND switches would never been closed again which would lead to performance losses. If the DC offset is too high and the limiter 126 is not limiting, the DC voltage applied at the gates of MNavss and MNbvss will be too high such that the AC signal with the DC offset will not be sufficient to switch the devices MNavss and MNbvss. In some examples, the body 128 of the device MP0 is coupled with the source of the device MP1 and the body 130 of the device MP1 is coupled with the source of the device MP0 to ensure no current flows through the device MP1 during the positive cycle of the input AC signal the negative cycle of the input and no current flows through the device MP0 during the negative cycle of the input AC signal.

Figure 5:
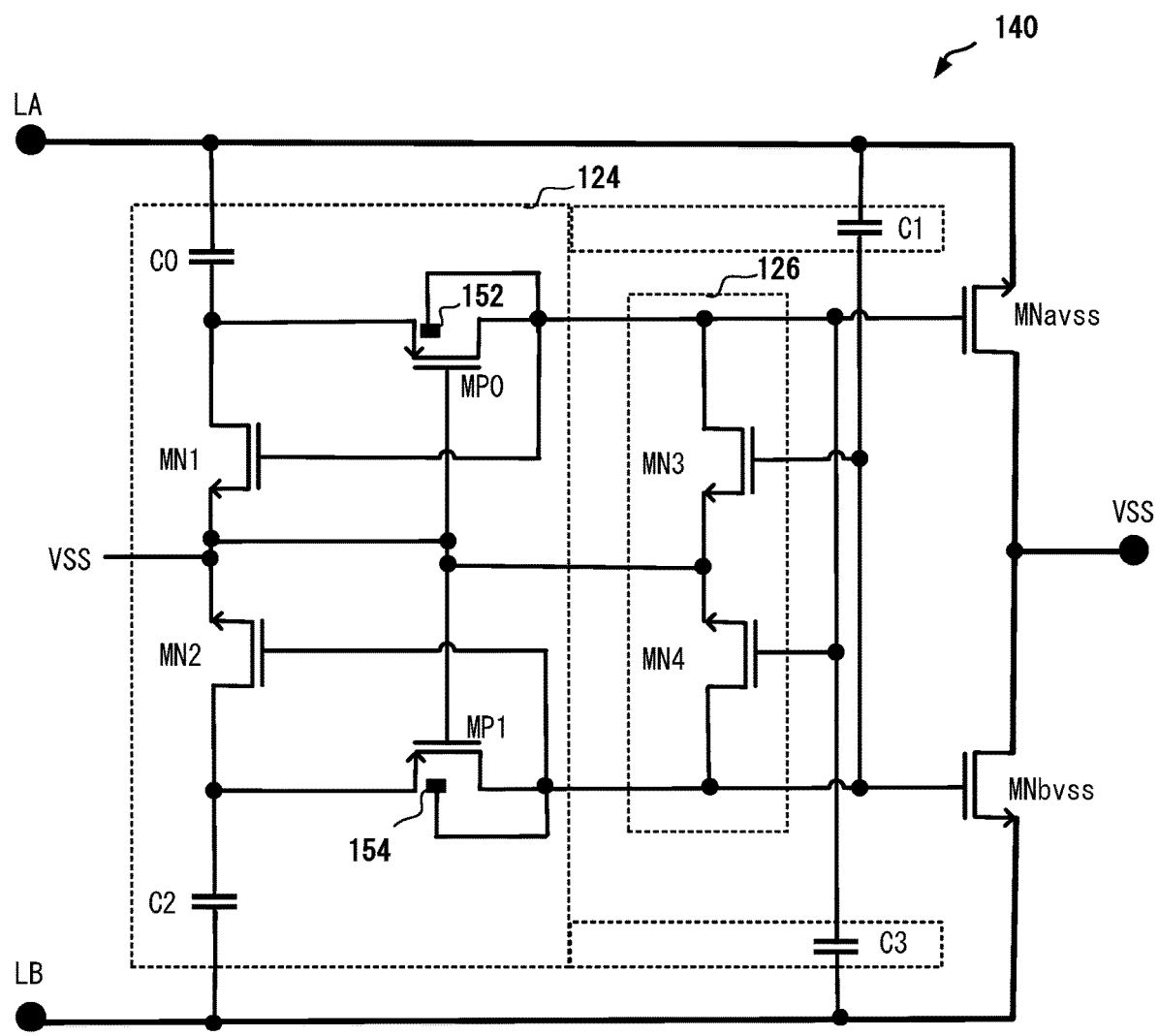
FIG. 5 shows a ground switch control circuit in accordance with one or more embodiments.

The threshold voltage ($V_{TH}$) of a field-effect transistor (FET) is the minimum gate-to-source voltage $V_{GS}$ that is needed to create a conducting path between the source and drain terminals. The threshold voltage ($V_{TH}$) of the device MN3 is higher than the DC offset and the amplitude of the input AC signal, the device MN3 will continue to work as a diode and will limit the DC offset to a predefined max voltage. However, if the AC signal strength increases, due to a higher field strength or shorter distance to the RFID reader, such that the DC offset voltage and the amplitude of the input AC signal is higher than VTH of the device MN3, the device MN3 will turned into a switch because at the highest of the voltage in a cycle of the AC voltage will turn the device MN3 on. The device MN4 will also exhibit the same operational characteristics. Adding the DC offset voltage provides and advantage that even low strength input AC signal will be able to turn the switches MNavss and MNbvss on/off. In some examples, to handle events such as electrostatic discharge (ESD), the devices MNavss and MNbvss needs to be bigger that will have a higher threshold voltage ($V_{TH}$). However, if the DC offset is too higher (in comparison with the threshold voltage of for example the device MNavss). The devices MNavss, MNbvss will never turn off because the DC offset+amplitude of the input AC signal will stay higher than $V_{TH}$ of the devices MNavss, MNbvss. The clamping circuit 126 is configured to keep the DC offset to a level such that the DC offset+Amplitude of the input AC signal is still able to turn on/off the devices MNavss, MNbvss. The improved ground switch described herein may be suitable for RFID devices to provide an stable ground to the components of the RFID device. FIG. 5 shows the ground switch control circuit 150 in another embodiment. In this example the body 152 of the device MP0 is coupled with its own source and the body 154 of the device MP1 is coupled with its own source.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A ground switch, comprising:
   an antenna port;
   a pair of switching devices coupled with the antenna port;
   a charge pump coupled with the pair of devices and configured to turn on/off the pair of devices based on an AC input signal received through the antenna port and a DC offset voltage added to the AC input signal, and wherein the charge pump includes an input capacitor coupled with a terminal of the antenna port; and
   a clamping circuit to clamp an output of the charge pump to a predefined level.

2. The ground switch of claim 1, wherein the clamping circuit includes a first clamp switch and a second clamp switch.

3. The ground switch of claim 2, wherein the charge pump includes a first output capacitor and a second output capacitor at the output of the charge pump.

4. The ground switch of claim 3, wherein the first output capacitor is coupled between a gate of the first clamp switch and a first terminal of the antenna port and the second output capacitor is coupled between a gate of the second clamp switch and a second terminal of the antenna port.

5. The ground switch of claim 2, wherein the clamping circuit is configured to clamp the output of the charge pump to a level such that an amplitude of the AC input signal added to the DC offset voltage fluctuates above and below a threshold voltage of each of the pair of switching devices.

6. The ground switch of claim 1, further including a ground port to provide a ground to connected components.

7. The ground switch of claim 1, wherein the charge pump further includes a first charge pump switch and a second charge pump switch both coupled with the input capacitor.

8. The ground switch of claim 7, wherein a type of the first charge pump switch is different from a type the second charge pump switch.

9. The ground switch of claim 1, wherein the charge pump includes a first NMOS transistor and a second NMOS transistor coupled with each other via sources and the first and the second NMOS are coupled between a first terminal and a second terminal of the antenna port through a first capacitor and a second capacitor.

10. The ground switch of claim 9, wherein the charge pump further includes a first PMOS transistor and a second PMOS transistor, wherein a drain of the first PMOS transistor is coupled with a gate of the first NMOS transistor and a drain of the second PMOS transistor is coupled with a gate of the second PMOS.

11. The ground switch of claim 10, wherein a body terminal of the first PMOS transistor is coupled with a source of the second PMOS transistor and a body terminal of the second PMOS transistor is coupled with a source of the first PMOS transistor.

12. A radio frequency identification (RFID) device including the ground switch of claim 1 to provide a stable ground to other components of the RFID device.

13. A method of providing a stable ground to circuit components of a radio frequency identification (RFID) device, the method comprising:
receiving AC input signal from an antenna;
generating a DC offset voltage and adding the DC offset voltage to the AC input signal using a charge pump and an input capacitor coupled between an output of the charge pump and the antenna;
limiting the DC offset voltage to a DC offset threshold; and
applying the limited DC offset voltage added to the AC input signal to a gate of a ground transistor coupled with a ground output.

14. The method of claim 13, wherein the limiting is performed by a clamping circuit that includes a first clamp switch and a second clamp switch.

15. The method of claim 14, wherein the generating the DC offset voltage is performed by a charge pump that includes a first output capacitor and a second output capacitor at the output of the charge pump.

16. The method of claim 14, wherein the clamping circuit is configured to clamp the output of the charge pump to a level such that an amplitude of the AC input signal added to the DC offset voltage fluctuates above and below a threshold voltage of the ground transistor.

* * * * *